US010622497B2

(12) United States Patent
Foos et al.

(10) Patent No.: US 10,622,497 B2
(45) Date of Patent: Apr. 14, 2020

(54) INORGANIC NANOCRYSTAL SOLAR CELLS

(71) Applicants: Edward E Foos, Alexandria, VA (US); Woojun Yoon, Fairfax, VA (US); Joseph G. Tischler, Alexandria, VA (US); Troy K Townsend, Alexandria, VA (US)

(72) Inventors: Edward E Foos, Alexandria, VA (US); Woojun Yoon, Fairfax, VA (US); Joseph G. Tischler, Alexandria, VA (US); Troy K Townsend, Alexandria, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 369 days.

(21) Appl. No.: 14/051,226

(22) Filed: Oct. 10, 2013

(65) Prior Publication Data
US 2014/0130869 A1 May 15, 2014

Related U.S. Application Data

(60) Provisional application No. 61/726,646, filed on Nov. 15, 2012.

(51) Int. Cl.
*H01L 31/0296* (2006.01)
*H01L 31/073* (2012.01)
*H01L 31/18* (2006.01)

(52) U.S. Cl.
CPC ........ *H01L 31/0296* (2013.01); *H01L 31/073* (2013.01); *H01L 31/1836* (2013.01); *Y02E 10/543* (2013.01)

(58) Field of Classification Search
CPC ............... H01L 31/073; H01L 31/0296; H01L 31/03925; H01L 31/0445; H01L 31/074; H01L 31/1828
See application file for complete search history.

(56) References Cited

U.S. PATENT DOCUMENTS 9,905,712 B2 * 2/2018 Foos ................... H01L 31/0296
2008/0280030 A1 * 11/2008 Van Duren ....... H01L 31/03928
427/74

(Continued)

OTHER PUBLICATIONS

Ju, T. et al "Thickness dependence study of inorganic CdTe/CdSe solar cells fabricated from colloidal nanoparticle solutions", Journal of Applied Physics. vol. 107, p. 104311 (2010).*

(Continued)

*Primary Examiner* — William E. Mcclain
(74) *Attorney, Agent, or Firm* — US Naval Research Laboratory; Stephen T. Hunnius

(57) ABSTRACT

An inorganic nanocrystal solar cell comprising a substrate, a layer of metal, a layer of CdTe, a layer of CdSe, and a layer of transparent conductor. An inorganic nanocrystal solar cell comprising a transparent conductive substrate, a layer of CdSe, a layer of CdTe, and a Au contact. A method of spray deposition for inorganic nanocrystal solar cells comprising subjecting a first solution of CdTe or CdSe nanocrystals to ligand exchange with a small coordinating molecule, diluting the first solution in solvent to form a second solution, applying the second solution to a substrate, drying the substrate, dipping the substrate in a solution in MeOH of a compound that promotes sintering, washing the substrate with iPrOH, drying the substrate with $N_2$, and heating and forming a film on the substrate.

3 Claims, 8 Drawing Sheets

(56) References Cited

U.S. PATENT DOCUMENTS

| | | | | |
|---|---|---|---|---|
| 2010/0236607 | A1* | 9/2010 | Korevaar et al. | 136/249 |
| 2011/0259424 | A1* | 10/2011 | Basol | H01L 21/02422 |
| | | | | 136/260 |
| 2012/0152346 | A1* | 6/2012 | Yang et al. | 136/256 |
| 2013/0327391 | A1* | 12/2013 | Gloeckler | H01L 21/02474 |
| | | | | 136/256 |
| 2014/0000690 | A1* | 1/2014 | Plotnikov | H01L 31/02242 |
| | | | | 136/255 |

OTHER PUBLICATIONS

Javier, et al. "Nanocrystal photovoltaic paint sprayed with a hand-held airbrush." IEEE Transactions on Nanotechnology 8.5 (2009): 569-573.*

Gur, et al. "Air-stable all-inorganic nanocrystal solar cells processed from solution." Science 310.5747 (2005): 462-465.*

Yoon, W., et al. "Solution processing of CdTe nanocrystals for thin-film solar cells." Photovoltaic Specialists Conference (PVSC), 2012 38th IEEE. IEEE, 2012.*

Townsend, et al., "Safer salts for CdTe nanocrystal solution processed solar cells: the dual roles of ligand exchange and grain growth." Journal of Materials Chemistry A 3.24 (2015): 13057-13065.*

* cited by examiner

INORGANIC NANOCRYSTAL SOLAR CELLS

REFERENCE TO RELATED APPLICATION

This application is a non-provisional of, and claims priority to and the benefits of, U.S. Provisional Patent Application 61/726,646 filed on Nov. 15, 2012, the entirety of which is hereby incorporated by reference.

BACKGROUND

This disclosure concerns a method for the fabrication of a solar cell on an opaque, non-conductive solid substrate, where all of the components of the device can be deposited using a spray-based solution process. Critical elements are found in both the method of deposition as well as in the unique architecture of the cell.

Solution synthesized inorganic nanocrystals are generally composed of an inorganic core surrounded by an organic ligand shell, and each of these components performs a distinct role in device fabrication.

The inorganic core provides electronic function and an opportunity to exploit quantum confinement effects not seen in bulk inorganic materials. For semiconductors, this occurs when the nanocrystal diameter falls below the Bohr exciton radius of the material.

The organic ligand shell stabilizes the core and enables the nanoclusters to dissolve in organic solvents, providing a practical means for the solution processing of inorganic devices.

One area where these materials are currently under intense examination is in the field of photovoltaics (PV), where this combination of electronic tuning via quantum confinement and solution processability hold promise for the fabrication of large area, flexible, and low-cost devices.

Initial approaches to the incorporation of nanocrystals into photovoltaics involved dispersing the material into a conductive polymer matrix. In this configuration, the nanocrystals absorb visible wavelength photons entering the active layer and consequently generate an exciton. Separation of this exciton into an electron and hole is aided by the polymer, serving as an electron transporting layer.

These early designs were plagued by low efficiencies and air sensitivity. In 2005, an all-inorganic design was first reported based on the heterojunction formed between layers of CdTe and CdSe nanorods deposited through a spin coating process and illustrated in FIG. 1. Note that this device contains no polymer in the region between nanorods, relying instead on the nanomaterial itself to generate and transport carriers. In addition to its improved power conversion efficiency of 2-3% under air mass 1.5 global filtered illumination, of particular note for this device is the measured air stability. Subsequent work has focused primarily on alternative material systems such as PbS and PbSe, and the dip coating of nanocrystal films via ligand exchange, with an eye toward harnessing carrier multiplication for high efficiency solar cells.

SUMMARY OF DISCLOSURE

Description

This disclosure concerns a method for the fabrication of a solar cell on an opaque, non-conductive solid substrate, where all of the components of the device can be deposited using a spray-based solution process. Critical elements are found in both the method of deposition as well as in the unique architecture of the cell.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

This disclosure concerns a method for the fabrication of a solar cell on an opaque, non-conductive solid substrate, where all of the components of the device can be deposited using a spray-based solution process. Critical elements are found in both the method of deposition as well as in the unique architecture of the cell.

Common to all of the devices discussed in the background section herein is a need to fabricate the structures on a transparent conductive substrate, such as indium-tin oxide (ITO) coated glass substrate, followed by deposition of a metal top contact through thermal or e-beam evaporation once the active layers are processed. Furthermore, most devices in the literature are fabricated through a spin coating process that deposits material inefficiently and is not amenable to irregular or arbitrary-shaped substrates. Dip coating has also been examined as an alternative, and while more efficient in terms of material usage, it requires large volumes of solution to be prepared as the substrate size increases. In practice, the nanocrystal deposition solution also has a limited shelf-life due to aggregation caused by cross-contamination with the organic ligands used for the exchange.

Alternatively, we have found spray application of nanomaterials via airbrush to compare favorably with these techniques, although surface roughness is generally increased while the overall uniformity is reduced.

A major advantage, however, is the potential of using non-standard substrates which are not compatible with either spin or dip coating. In addition, the material deposition efficiency is much higher. For a 500 nm film deposited on a 25×25 mm substrate, the spray coating is about four times more efficient than spin coating.

In order to enable this vision—the deposition of a complete solar cell on any solid surface using only sprayed material solutions—several critical elements must be addressed in both the processing and design of the device. This disclosure outlines methods to address these issues, overcomes the problems associated with the currently used methods as in prior art, and demonstrates a better method and product than previously known.

EXAMPLE 1

Spray Deposition Processing

Currently, the ligand shell that surrounds the nanocrystals following synthesis promotes solubility of the material and facilitates the solution deposition process, but serves as a barrier to electron transport. In order to obtain active layers with sufficient carrier mobility to promote charge transport in the device, the ligands present on the as-prepared materials must be removed or reduced in size.

Ligand exchange and thermolysis are two strategies for accomplishing this task thereby increasing the carrier mobility of the deposited films.

Figure 2:
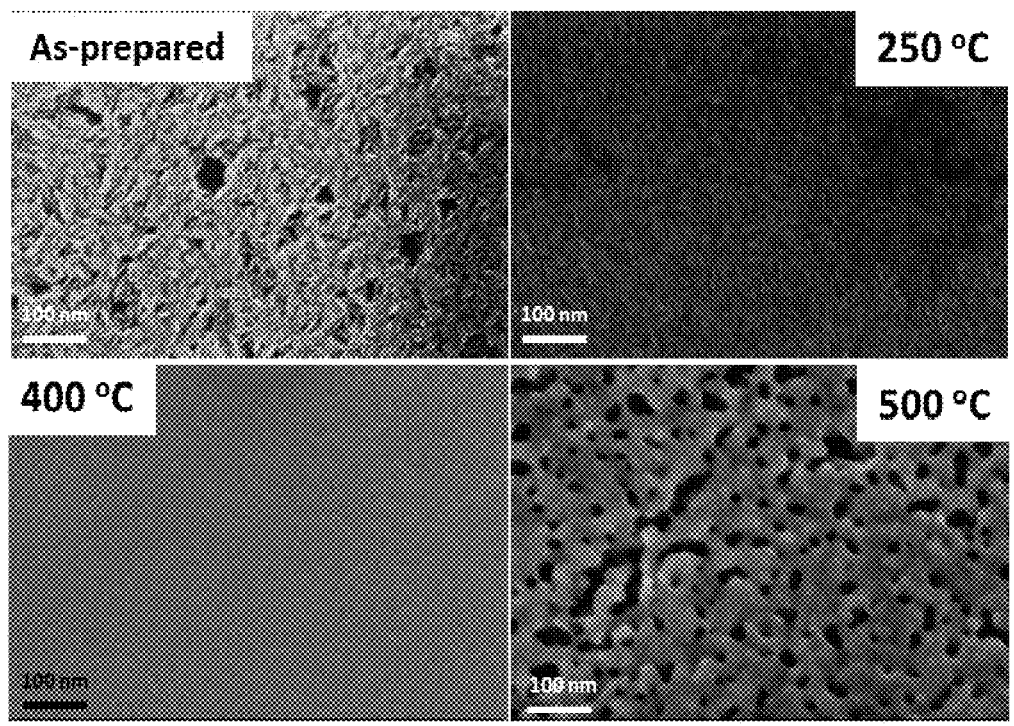
FIG. 2: Effect of annealing CdSe nanorod films at various temperatures. No $CdCl_2$ was used in these samples.

Specific to cadmium chalcogenide materials, a 400° C. sintering treatment coupled with $CdCl_2$ exposure has been shown to also increase the grain size, further improving transport in the film. A pitfall with this approach is the film damage that can occur due to loss of the organic volume from the deposited material, primarily through cracking and pinhole formation. FIG. 2 illustrates this, and shows SEM images of CdSe nanorod films heated to various temperatures. The pinholes and cracks present can lead to shorts when a metal contact is placed on top of the film, particularly if the material layer is kept thin.

To avoid this problem, multiple layers can be deposited to fill in the gaps and correct or "fill-in" these film defects as they form. Ligand exchanged films prepared through dip coating rely on this process for their continuity, which has also been adapted to spin coating. Recently, an iterative approach to this process was reported where a thin layer of CdTe nanocrystals are deposited through spin coating, followed immediately by a 10 sec sintering treatment. The process is then repeated for the next layer, which fills in any defects in the film and slightly increases the overall thickness.

In practice, while this process produces high quality films, it is tedious and requires 10 cycles to produce an ~500 nm thick film.

Here, we have incorporated this strategy into a new spray coating process, and found it to also produce high quality material films suitable for devices while depositing thicker layers during each cycle. Importantly, substrates can also be coated in parallel with this process, unlike spin coating which is inherently serial. This dramatically reduces the time necessary for the preparation of multiple samples.

This new spray procedure is conducted as follows.

A 40 mg/ml concentrated stock solution of CdTe or CdSe nanocrystals, previously subjected to overnight ligand exchange with pyridine, is diluted in $CHCl_3$ to a concentration of 1 mg/mL.

This solution is then applied to a vertically mounted 80° C. substrate via airbrush with a steady pressure of 20 psi $N_2$ as the carrier gas.

When ~¼ of the solution has been applied, the sample is removed, dried for 2 min at 150° C., then dipped in a saturated solution of $CdCl_2$ in MeOH held at 60° C.

Following this dip, the substrate is immediately washed two times with fresh iPrOH, blown dry with $N_2$, and placed on a 400° C. hot plate in air for 1 min.

The sample is then remounted and the next ¼ of solution applied following the same protocol. After a total of four cycles, the film is ~500 nm in thickness.

The final thickness can be controlled either by reducing the number of steps, or by adjusting the concentration of the stock solution.

A second material can easily be introduced into the structure to form a heterostructure at any time by simply substituting a different spray solution prepared at a similar concentration.

Figure 7:
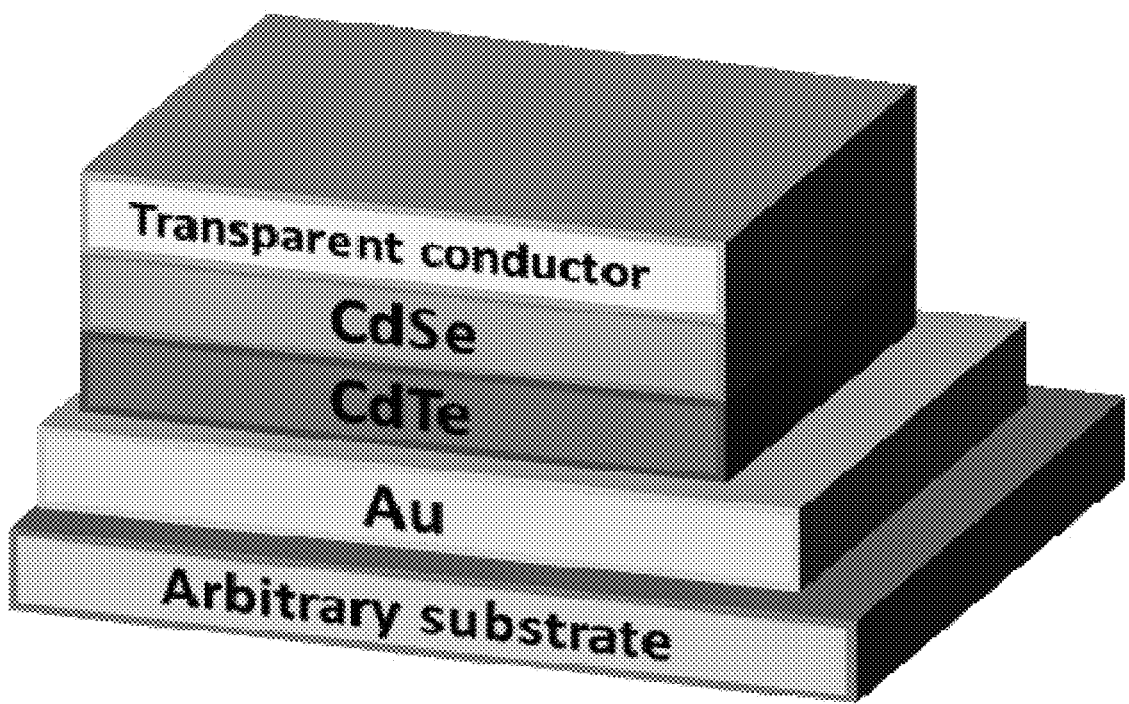
FIG. 7: Schematic of the inverted heterostructure referenced in this disclosure.

The device measured in FIG. 7 (vide infra) was prepared in this fashion.

It is worth noting that functional devices can be produced with processing temperatures lower than 400° C. using this procedure. The performance of these samples can decrease as the temperature is reduced, however. Several strategies for lowering the temperature of this processing step while maintaining performance include small molecule ligand exchange and the inclusion of inorganic nanowires.

Figure 3:
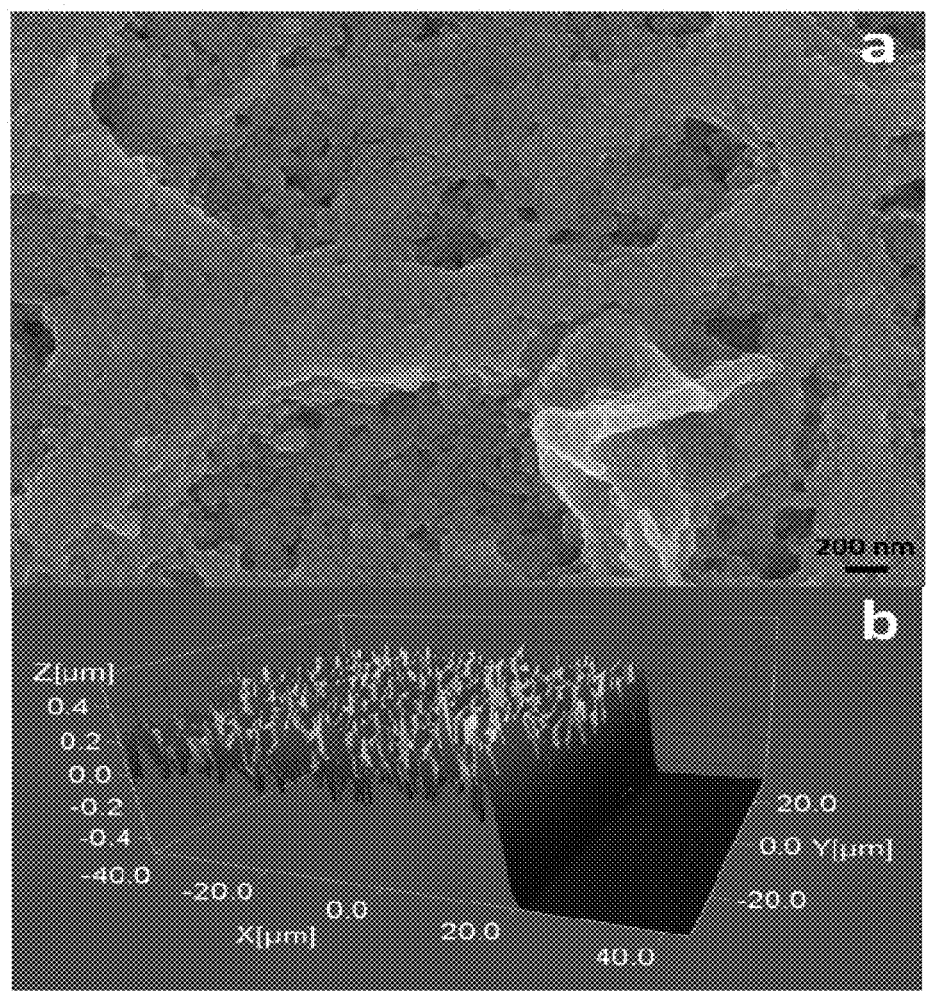
FIG. 3: (a) SEM image of the top surface of a CdTe film prepared using the described spray procedure, and (b) profilometry data for the same film.

FIG. 3(a) shows an SEM image of the top surface of the CdTe following this procedure. In addition to the increase in grain size to approximately 200 nm, large surface roughness features can be seen. These are illustrated more profoundly in the profilometry data in FIG. 3(b). While traditionally roughness is thought to be detrimental to device performance, in the case of these sintered all-inorganic devices we unexpectedly find the impact to be limited.

Table 1 shows data comparing single layer CdTe Schottky-barrier solar cells (glass/ITO/CdTe/Ca/Al) fabricated from both spin and spray coating.

TABLE 1

Summary of Schottky PV device data comparing spin and spray coating

| Device | Average thickness (nm) | RMS roughness (nm) | $J_{sc}$ (mA/cm$^2$) | $V_{oc}$ (V) | FF (%) | Eff. (%) |
|---|---|---|---|---|---|---|
| CdTe Schottky (spin) | 435 | 3.9 | 13.2 ± 0.2 | 0.53 ± 0.02 | 43.1 ± 4.2 | 3.0 ± 0.3 |
| CdTe Schottky (spray) | 510 | 202 | 13.3 ± 3.0 | 0.39 ± 0.06 | 45.7 ± 3.4 | 2.3 ± 0.3 |

Despite the substantial increase in surface roughness, overall the performance of the sprayed device is very similar to the traditional spin coated sample.

The processing advantages noted above are such that these minor differences could be tolerable for many applications, and the increased roughness could possibly benefit some structures through increased light trapping.

Careful adjustment of the spray parameters are used as a tool to control the film morphology. By adjusting the concentration of the spray solution, the pressure of the carrier gas, and the temperature of the substrate during deposition, the morphology and surface roughness of the film can be controlled.

For example, when the CdTe solution concentration is increased to 4 mg/mL, the pressure is increased to 40 psi, and the substrate is held at room temperature, the surface RMS roughness decreases by a factor of six as shown in Table 2.

TABLE 2

Summary of profilometry data for CdTe films sprayed at different pressures on ITO coated glass substrates

|  | Carrier gas pressure (psi) | | | |
| --- | --- | --- | --- | --- |
|  | 15 | 20 | 30 | 40 |
| Thickness (nm) | 779 | 249 | 144 | 244 |
| Roughness (nm) | 205 | 124 | 40 | 19 |

Figure 4:
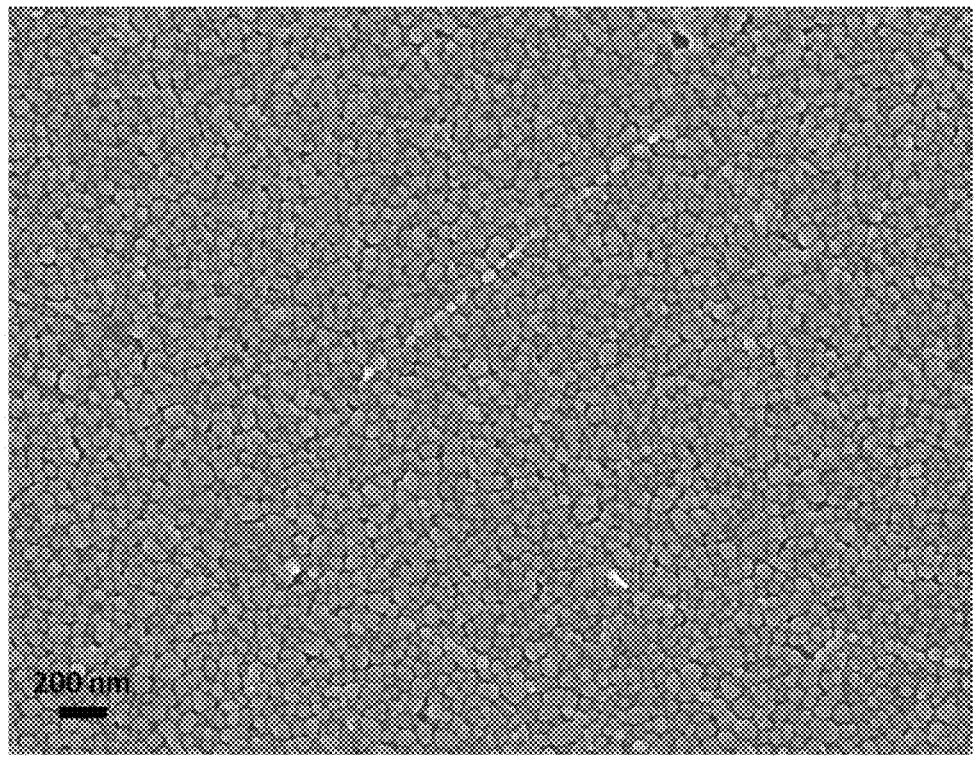
FIG. 4: SEM image showing CdTe grain formation after exposure to $NH_4Cl$ and sintering at 375° C. for 1 min.

This is also illustrated in FIG. 4, which shows SEM images comparing films prepared with 1 mg/mL stock on an 80° C. substrate to 4 mg/mL stock on a room temperature substrate.

An important point is that the tuning of these parameters enables the films to be intentionally prepared with a controlled amount of roughness, something that is not possible with spin or dip coating procedures.

This is advantageous for the preparation of films where reduced light reflectivity is desired.

In addition, the observed grain growth that is critical to solar cell performance is not limited to the use of $CdCl_2$ for the sintering step, and we have found other cadmium halides as well as $NH_4Cl$ and trimethylsilyl chloride to also promote CdTe grain growth when substituted into the process.

Figure 5:
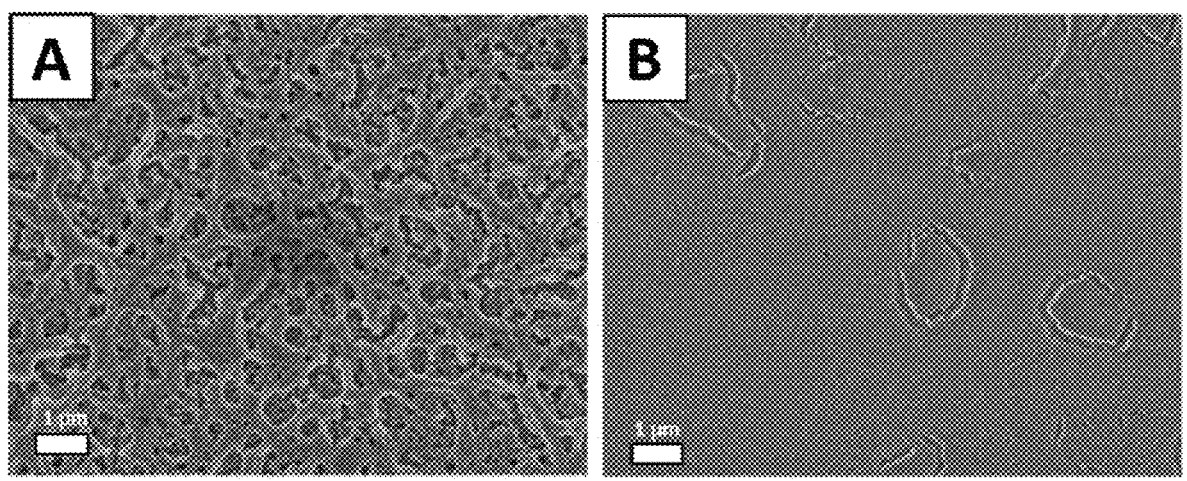
FIG. 5: SEM image comparing surface roughness of films prepared (A) from 1 mg/mL stock at 80° C. and (B) from 4 mg/mL stock at room temperature.

FIG. 5 shows an SEM image of a CdTe nanocrystal film following exposure to a 50 mM solution of $NH_4Cl$ in MeOH, followed by heating to 375° C. for 1 min. The grains visible are comparable in size to those seen in FIG. 3(a) for the $CdCl_2$ treatment.

Furthermore, it is worth noting that the films resulting from this spray process are able to tolerate additional processing steps without damage.

Sprayed CdTe and CdSe films were robust enough to withstand a standard photolithography lift-off process consisting of Microposit® S1800 series photo resist, LOR™ lift-off resists, MF-319 developer, Nano™ remover PG, acetone and iso-propanol.

Figure 6:
FIG. 6: Optical microscope image of a Au grid patterned on top of a sprayed CdTe nanocrystal film by standard lift-off process.

The films displayed no observable film-shrinkage, peeling, or warping during this process. An optical microscope image of Au patterned on sprayed CdTe is shown in FIG. 6.

EXAMPLE 2

Architecture

While the spray procedure outlined in the previous section is applicable to a variety of materials and surfaces beyond those described in the Example, further changes to the device architecture are required to enable solar cell fabrication on non-conductive substrates.

Figure 1:
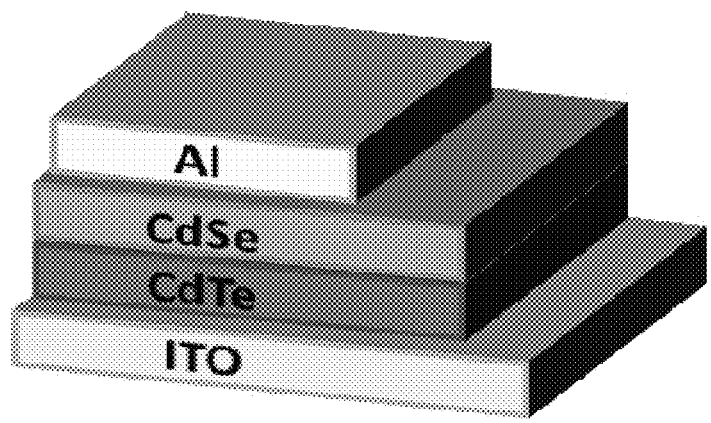
FIG. 1: Schematic of an all-inorganic nanocrystal-based PV device.

A schematic of the proposed inverted heterostructure of such a device is shown in FIG. 7. Note that unlike FIG. 1, this device is not fabricated on a conductive substrate but rather on any solid, non-porous surface that can support the layers.

As this device is constructed "upside-down" it necessitates the deposition of the metal contact first as the initial layer. Active metals with low work functions such as Al or Ca are often used in Schottky-barrier solar cells based on nanocrystals to enhance performance. Due to their reactivity, however, solution deposition of these metals in nanocrystalline form is not an option under ambient conditions.

High work function, noble metals such as Au, Pt, and Ag are far more stable and resistant to oxidation, and solution syntheses for their nanoclusters are well known. Conductive Ag paint is also commercially available. The deposition of Au nanoclusters can also be accomplished via airbrush, and thermal treatment above 200° C. results in the formation of a metallic Au film on the non-conductive substrate of interest. It is also possible to consider use of highly conductive polymers or transparent conducting oxides in place of the metal; if the substrate is also transparent this would produce a "semi-transparent solar cell".

Using a higher work function conductive contact then necessitates a reversal in the position of the nanocrystal active layers of the device in order to improve the energy level alignments at the material interfaces. Note that the FIG. 7 structure places the CdTe layer directly in contact with the metal, unlike in FIG. 1 where the CdSe occupies this position.

This reversal is critical for fabricating a functioning solar cell entirely through a spray coating process, as it enables the use of less reactive noble metals as the back contact.

Figure 8:
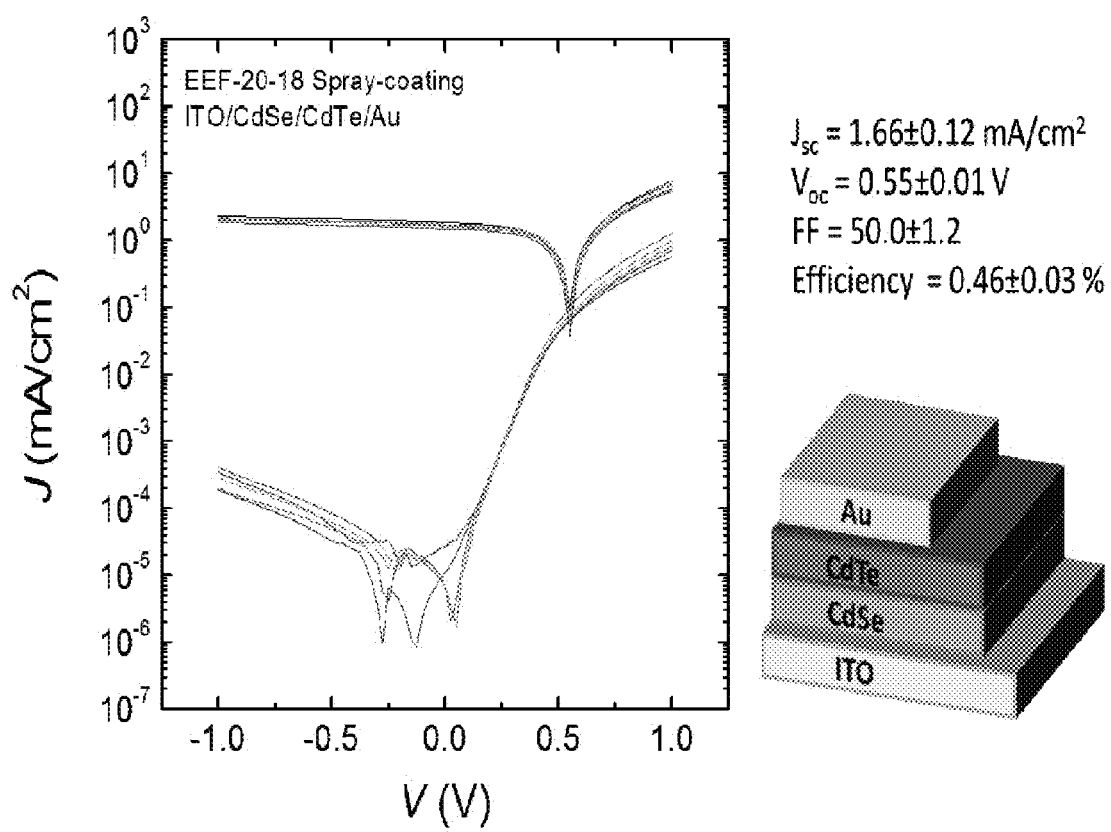
FIG. 8: Performance data for an inverted heterojunction PV device.

FIG. 8 shows the current density-voltage characteristics (J-V) under air mass 1.5 global conditions for devices employing this inverted heterostructure. Of particular importance is the excellent open-circuit voltage ($V_{OC}$) exhibited. Layer thicknesses (in particular the CdSe) have not been optimized in this device and are contributing to the low overall efficiency. While one literature report claims to have attempted this inverted structure with no success, the authors stated that a possible reason for their failure was shorting through the CdSe layer. Our spray process as described in Section 1 above is critical to avoiding this problem.

Furthermore, it is important to note that while the active layers of the device measured in FIG. 8 were processed using spray coating, ITO-coated glass was used for the substrate and the Au contacts were e-beam evaporated. The device in FIG. 7 requires a low sheet resistance, transparent top contact that can also be spray deposited as the final step. Materials such as carbon nanotubes, metal nanowires, or combustion synthesized ITO are excellent choices in addition to conventional conducting polymers (e.g. PEDOT: PSS).

The work disclosed here consists of a process and an architecture that is designed for the spray based deposition of an entirely inorganic device on potentially any non-porous substrate of interest. Current device architectures or active layers that rely on low work function metal contacts or air sensitive materials cannot be used in this type of design.

In addition, the spray process is much faster and enables multiple substrates with a large area to be processed in parallel, dramatically reducing fabrication time.

One advantage over previous work is the iterative nature of the spray process, which limits the effect of film defects created during sintering. The morphology of the film can also be controlled with greater precision.

This results in pinhole free films suitable for devices despite the high surface roughness.

Alternatives for solution processed active layers exist (e.g. organic materials, other nanocrystal systems) but do not possess the air stability found in the system described above. The iterative spray approach is also important for the formation of defect free layers that support charge transport. Finally, the architecture employed is critical in that it allows the material system to function when all components including the top and bottom contact are applied using a spray deposition process.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What we claim is:

1. An inorganic nanocrystal solar cell comprising:
   a solid non-porous non-conductive non-transparent substrate;
   a layer comprising one selected from the group consisting of conductive polymer, transparent conducting oxide, and Au;
   a sprayed-on nanocrystalline layer of sintered and recrystallized CdTe nanoparticles;
   a sprayed-on layer of CdSe;
   wherein the surface roughness of the sprayed-on nanocrystalline layer of CdTe nanoparticles is about 19 nm and wherein the sprayed-on layer of CdSe is sprayed onto the sprayed-on nanocrystalline layer of CdTe nanoparticles;
   wherein trimethylsilyl chloride is used to sinter or recrystallize the CdTe;
   wherein the sprayed-on layer of CdSe is sprayed onto the sprayed-on nanocrystalline layer of CdTe nanoparticles from a solution via airbrush; and
   a layer of transparent conductor on the sprayed-on layer of CdSe.

2. The inorganic nanocrystal solar cell of claim 1 wherein the layer of transparent conductor is one selected from the group consisting of carbon nanotubes, metal nanowires, combustion synthesized indium-tin oxide, and conductive polymer, wherein the sprayed-on nanocrystalline layer of CdTe particles has a thickness of about 244 nm, wherein the sprayed-on layer of CdSe is sprayed onto the sprayed-on nanocrystalline layer of CdTe particles from a solution via airbrush with a steady pressure of 20 psi $N_2$ as the carrier gas; and wherein the grain size of the sprayed-on nanocrystalline layer of CdTe particles is 200 nm.

3. An inorganic nanocrystal solar cell product made by the process consisting of:
   subjecting a first solution of CdTe or CdSe nanocrystals to ligand exchange with a small coordinating molecule;
   wherein the first solution of CdTe or CdSe nanocrystals is diluted and forms a second solution which has a concentration lower than the first and is 1 mg/ml;
   applying the second solution to a substrate;
   wherein the second solution is applied to the substrate that is vertically mounted and at a temperature of 80° C. and applied via spraying with a carrier gas pressure of 20 psi;
   wherein the spraying comprises airbrush and wherein the carrier gas is $N_2$ and wherein the first solution of CdTe or CdSe nanocrystals is a 40 mg/ml solution and further including the step of utilizing an air brush for the step of applying the second solution to the substrate;
   wherein after about two or more cycles of applying the second solution to a substrate, drying the substrate, dipping the substrate, washing the substrate, drying the substrate and heating the substrate, the film is about 500 nm in thickness;
   drying the substrate;
   dipping the substrate in a solution in MeOH of a compound that promotes sintering;
   wherein the compound that promotes sintering is trimethylsilyl chloride;
   washing the substrate with iPrOH;
   drying the substrate with $N_2$; and
   heating the substrate and forming a film on the substrate;
   repeating the steps of
   applying the second solution to the substrate;
   drying the substrate;
   dipping the substrate in the solution in MeOH of the compound that promotes sintering;
   wherein the compound that promotes sintering is trimethylsilyl chloride;
   washing the substrate with iPrOH;
   drying the substrate with $N_2$; and
   heating the substrate.

* * * * *